United States Patent [19]

Smith et al.

[11] Patent Number: 4,868,770
[45] Date of Patent: Sep. 19, 1989

[54] SIMULATION RESULTS ENHANCEMENT METHOD AND SYSTEM

[75] Inventors: David W. Smith, Forest Grove, Oreg.; Martin Vlach, Waterloo, Canada

[73] Assignee: Analogy, Inc., Portland, Oreg.

[21] Appl. No.: 127,775

[22] Filed: Dec. 2, 1987

[51] Int. Cl.$^4$ .................... G06F 15/20; G06F 15/60
[52] U.S. Cl. .................................. 364/578; 364/200; 364/488; 364/900
[58] Field of Search ............... 364/200, 900, 300, 488, 364/489, 578, 802, 490, 491, 518; 434/301

[56] References Cited

U.S. PATENT DOCUMENTS

| | | | |
|---|---|---|---|
| 3,705,409 | 12/1972 | Brayton et al. | 364/488 |
| 4,527,249 | 7/1985 | Van Brunt | 364/578 |
| 4,651,284 | 3/1987 | Watanabe et al. | 364/491 |
| 4,695,968 | 9/1987 | Sullivan, II et al. | 364/490 |
| 4,697,241 | 9/1987 | Lavi | 364/488 |
| 4,742,473 | 5/1988 | Shugar et al. | 364/518 |

OTHER PUBLICATIONS

Elec. Eng (Sep. 1980); "A Computer Architecture for Digital Logic Simulation"; R. Barto et al.; pp. 35-36.

Int. Conf on CAD; (Apr. 1969); "Application of On-Line Computer Techniques to Automated Linear Circuit Design"; pp. 130-139.

Electronics; (Apr. 1974); "Magic: A Computer Program for Optimizing Linear Circuits"; J. D. Trudel, pp. 138-141.

Electronics: (May 1975); "Circuit Analysis Program Can Model Many Digital ICs Automatically"; pp. 93-96.

IEE Electronics Design Automation (3/84); "Circuit Analysis Program Using Attached Array Processor"; pp. 13-17.

IEE Elect. Des. Auto. (3/84); "Design of Hierarchical Circuit-Level Simulator"; pp. 9-12.

Primary Examiner—Parshotam S. Lall
Assistant Examiner—Kevin J. Teska
Attorney, Agent, or Firm—Kolisch, Hartwell & Dickinson

[57] ABSTRACT

Simulation results enhancement software method and system are disclosed. A partial simulation results data base that is produced by an interactive simulator is software enhanced, using full elemental characterizations from the modeling subsystem thereof, to produce a simulation completion results data base. The simulation completion results data base is suitable for post-simulation processing to enable the viewing or plotting of any dependent variable, or transform thereof, available from the modeling subsystem. A simulation-produced interim results data base provides, in association with a software co-processor, the capability of interrupting the simulation upon the occurrence of a user-defined event. Use of the enhancement software is illustrated in the context of analog circuit simulation, whereby voltage, current and power waveforms are made available to the user without unduly burdening the computer system on which the simulation software is executed.

7 Claims, 1 Drawing Sheet

SIMULATION RESULTS ENHANCEMENT METHOD AND SYSTEM

BACKGROUND AND SUMMARY OF THE INVENTION

This invention relates generally to computer simulation results enhancement, and more particularly to the enhancement of partial simulation results by the post-simulation processing of a partial results data base using elemental characteristics available from the modeling subsystem upon which the partial simulation was based.

Simulation systems are widely used in various product development environments, including design and manufacturing engineering. They are also used in a variety of engineering disciplines, including electrical and mechanical engineering. Simulation software is traditionally equipped with a modeling subsystem adapted to a particular engineering discipline.

An electrical engineer might, by defining a circuit as a combination of elemental models that describe, in turn, voltage and current characteristics of the element, construct a model of a circuit to be simulated. The engineer might then designate the values of constants within the system, e.g. the value of a resistor or capacitor, and specify the initial conditions of desired system stimuli.

By executing a simulation program that accesses this circuit model, the engineer may determine, by viewing or plotting tabulated data or waveforms, the circuit's response to such stimuli, thereby predicting the operational behavior of the circuit. Thus, the costly, iterative trial and error process inherent in circuit design may be expedited and cost reduced. If it is discovered, during viewing or plotting, that a particular nodal voltage is not within permissible parameters or is otherwise undesirable, the circuit may be redefined by adding or changing a device type or value, and the simulation may be repeated. A circuit's theoretical operation thus may be tested and its operational parameters proved or improved, without resort to what is referred to as breadboarding.

Simulation software traditionally produces only partial simulation results, e.g. nodal voltages as a function of time. Memory capacity, turnaround time and budget traditionally constrain the extent to which simulation results include, for example, the instantaneous current flowing in, or the instantaneous power dissipated by, a circuit element. A simulator capable of producing what may be thought of as an interim results data base that enables the derivation, from the modeling subsystem, of multiple variable waveform characteristics is described in my co-pending application, Ser. No. 06/918,383, entitled "System Performance Simulator", filed Oct. 14, 1986, as well as in my co-pending application (a continuation thereof), Ser. No. 07/264,383, entitled "System Performance Simulator", filed Oct. 31, 1988.

Post-simulation processing of such an interim results data base, using a modeling subsystem that is capable of fully characterizing a circuit element to include, e.g. current (I) as a function of voltage (V) based upon the element's V-I attributes, would allow the production of more complete, and thus utility enhanced, simulation results.

Equally importantly, co-simulation processing of such an interim data base would render the simulation more interactive with, and responsive to, to the user. For example, because they are not essential to the completion of a simulation run, particular device parameters may be exceeded without the indication, if at all, until after the simulation has fully executed. Thus, it is desirable for a simulation system to allow the user selectively to augment an elemental model, e.g. by inputting specific parameters such as $P_{d,max}$ of a resistor or $V_{ce,max}$ of a transistor, and to determine, during the simulation run, whether such parameters are exceeded. Further, the ability to control a simulation while it is executing, e.g. by conditionally halting or branching, would save significant execution time. It also would ensure that the simulation comprehensively predicts the operation of the circuit modeled by the user.

The present invention discloses a software system and method whereby partial simulation results may be enhanced by software associated with the partial results data base and with the modeling subsystem to produce simulation completion results It also permits a user to specify parameters of interest to the particular application, thereby to control the simulation run. The enhancement software of the present invention provides unprecedented performance in interactive simulation.

A principal object of the invention is to provide simulation results enhancement software that fully exploits the elemental characterization capability of the modeling subsystem part of a simulation system.

An important object of the invention is to provide a method of enhancing a partial simulation results data base by post-simulation processing of the same, using the elemental modeling subsystem.

Another principal object of the invention is to provide simulation results enhancement software that permits user-inputted, expression-defined events to control the simulation.

A further object of the invention is to provide such software and such a method that are compatible with existing modeling subsystems and simulation systems.

According to a preferred embodiment of the invention, results enhancement software is operatively associated with a partial simulation results data base, produced by simulation software, and the modeling subsystem of such simulation software. The simulation completion results data base produced thereby represents all pertinent circuit attributes within the purview of the modeling subsystem, rather than simply those attributes needed to execute a simulation. Importantly, attributes of a device that are deemed pertinent may be added by the engineer to an elemental model, referred to herein as a template. Thus, the central library of elemental models may still be maintained by, e.g. a central data base group, while the templates may be customized, via an expression-oriented interface, to a particular user's application. The preferred embodiment is illustrated in the context of analog circuit design, as providing a data base representation of voltage, current and power as a function of time.

By the preferred embodiment or method of practicing the invention, the advantage of lower cost simulation is combined with utility enhanced results that include complete circuit characterization.

These and other advantages and features of the invention will become more fully apparent when the detailed description below is read with reference to the accompanying drawings.

DETAILED DESCRIPTION OF THE PREFERRED EMBODIMENT

Enhancement software of the instant invention operates to enhance the interactivity with, and responsiveness to, a user of a simulator, such as the Saber Simulator available from Analogy, Inc. of Beaverton, Oreg. The Saber Simulator allows a user to simulate the interaction of elements having a variety of characteristics. The elements modeled by such a simulator may be electrical, mechanical or chemical in nature, depending upon the user's discipline. Such elements may take on other characteristics as well. For the purposes of the explanation which immediately follows, elements that are electrical in nature will be used to illustrate how a simulator may be enhanced according to the present invention.

Figure 1:
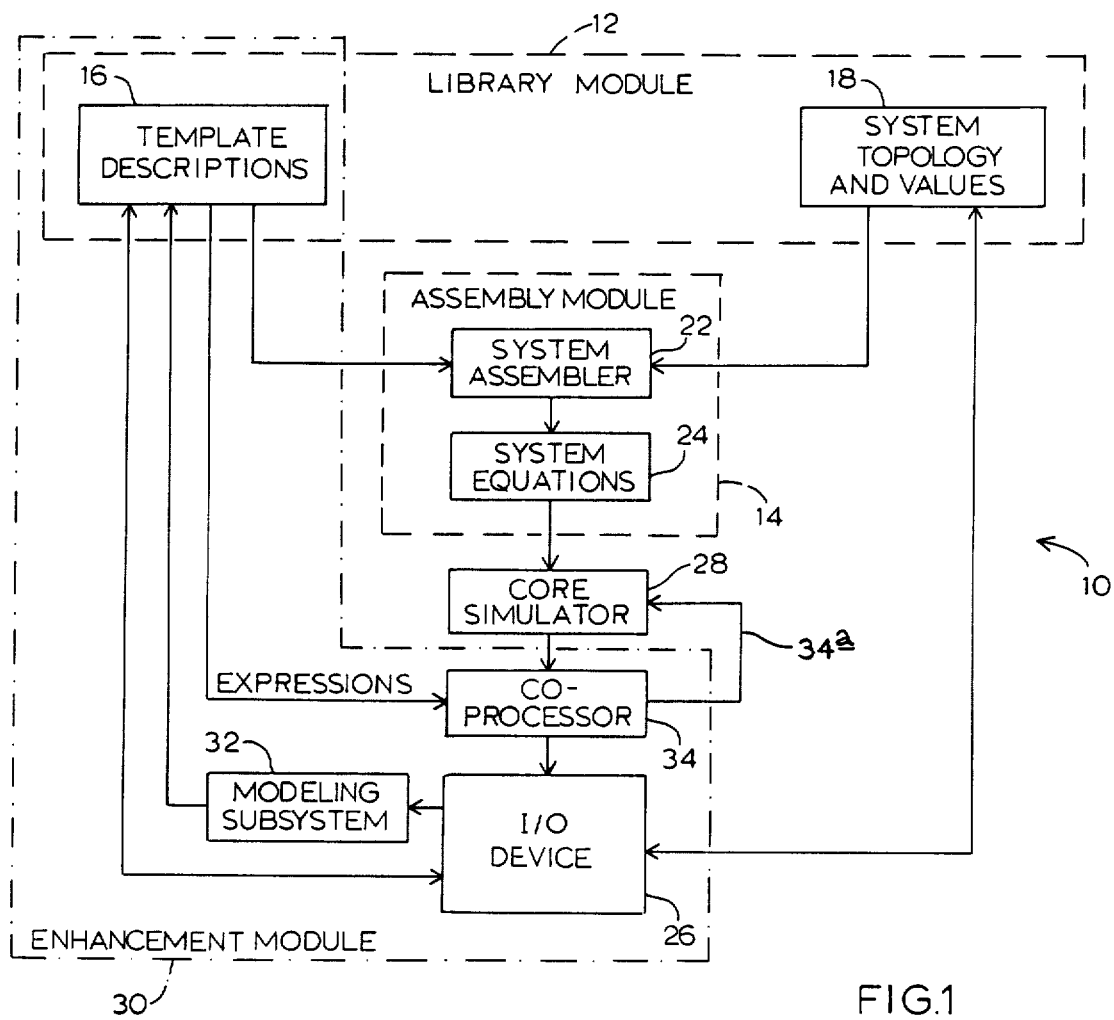
FIG. 1 schematically illustrates a block diagram of an enhanced simulation system, in block diagram form, structured in accordance with the preferred embodiment of the invention.

In FIG. 1, a system performance simulator structured in accordance with the invention is shown generally at 10. Simulator 10 includes a library module 12 and assembly module 14. Library 12 includes a collection of template descriptions 16 and a circuit interconnection description, or system topology, section 18, which describes which library elements are included in the system to be simulated, their interconnections relative to one another, and constant values associated therewith, e.g. the resistance, in ohms, of a resistor.

Figure 2:
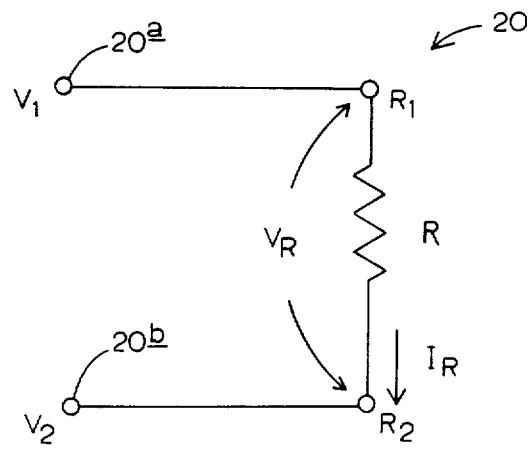
FIG. 2 schematically illustrates a circuit that may be simulated by the method and apparatus of the invention.

Referring collectively to FIGS. 1 and 2, the terminology used herein will be explained by way of example. FIG. 2 shows a simplistically illustrative electrical circuit, or system, 20 consisting of a single, resistive element R, and having associated therewith the independent variable $V_R$, or the voltage across resistor R, and the dependent variable $I_R$, or the current through resistor R, which is derived from $V_R$. In a typical system, pins 20a, 20b are associable, via system topology 18, with pins of other elements, e.g. capacitors, transistors, etc. The operational description of a generic resistor, defining its two terminals $R_1$, $R_2$, and the dependent relationship between voltage and current, $I_R = V_R/R$, is available as one of many template descriptions 16 within library module 12. It will be seen that, without information beyond that available from template descriptions 16 and system topology and values 18, assembly module 14 is capable of producing a system of equations consisting, in the simplistic example illustrated herein, of a single equation that fully describes the response of circuit 20 to various stimuli.

It may be seen that assembly module 14 includes system assembler 22, which, based upon inputs from library module 12, produces a set of system equations 24. It will be appreciated that, although fully described in terms of the relationship between voltage and current, the operation of circuit 20 may not be simulated meaningfully in a void. In other words, it may be thought of as performing, or responding, only in the context of predefined stimuli, such as a voltage that may be impressed across pins 20a, 20b of circuit 20. Therefore, a user must supply the context in which the performance of circuit 20 is thought to be important.

In a trivial case, of course, e.g. where a static DC voltage, e.g. $V_1 - V_2$, is impressed across pins 20a, 20b of circuit 20, no simulator is needed, because an engineer easily may calculate the current $I_R$ through resistor R, either mentally or with the aid of a calculator. If, on the other hand, $V_1 - V_2$ is time variant, then the response of circuit 20 to that input, in terms of the current $I_R$ through resistor R, may not be determined so straightforwardly. The engineer may, for example, wish to view a display or plot of $I_R$ or $V_R$ as a function of time. This may be accomplished by first defining $V_1 - V_2$, e.g. by inputting its value to system topology and values 18 via I/O device 26. With $V_1 - V_2$ thus defined, the execution of assembler 22 produces equations 24, which describe the current through resistor R in terms of time variant $V_1 - V_2$. By solving equations 24, core simulator 28 may produce what is referred to herein as a partial, or interim, results data base structure capable of representing the desired $V_R$ and $I_R$ waveform graphs.

It is important to note that, to this point, the user has neither inputted information to, nor in any way modified, template descriptions 16. The pertinent characterization of the V-I attributes of a resistor, which is one of many generic device characterizations that may be included in template descriptions 16, is applicable generally to any circuit, or to any system description. Thus, a central data base group may create and maintain generic template descriptions 16, adding new elements as engineers discover the need to model devices not yet described. Without modifying the generic attributes of various templates found therein, an individual user nevertheless may adapt, to a particular application, the centrally maintained library of template descriptions 16. For example, while not essential to solving a system of equations relating the voltage across, and the current through, a resistor, nevertheless the power dissipated by a resistor, which is a function of both voltage and current, is a desirable performance simulation result.

Completion results means for enhancing the utility of the simulator-produced results data base to the extent of the modeling capability of the simulation system, or enhancement module 30, enables an engineer who desires to analyze the power dissipated in a device, such as resistor R of circuit 20 in FIG. 2, straightforwardly to customize, via I/O device 26, a copy of the pertinent template description, whereby attributes that are a function not only of at least one independent variable, e.g. $V_R$, but also of at least one dependent variable, e.g. $I_R$ or $P_R$, which derives therefrom, may be represented.

For example, the user may enter, into a copy of the resistor template via modeling subsystem 32, the expression $$P_R = V_R I_R \qquad (1)$$

which system assembler 22 will interpret as equivalent to $P_R = V_R(V_R/R)$. When core simulator 28 is run, what is referred to herein as a partial results data base will be produced that includes V as a function of time. By the enhancement software, or method and apparatus, proposed herein, co-processor 34 then may operate on the partial results data base to produce completion results of the simulation, including evaluation of the user-defined expression (1) above. It will be understood that simulator 28 produces $V_R$ as a function of time, and that system topology and values 18 provides a value of R, which is a constant Thus, post-processor 34 may solve expression (1) by solving the equation $P_R = V_R \cdot (V_R/R)$, to determine the power $P_R$ dissipated in resistor R as a function of time, thereby deriving what may be thought of as a simulation completion results data base structure capable of representing the desirable $P_R$ waveform graph. Thus, the simulation results are enhanced by the addition of user-specific, or application-specific, simulation results that yield highly desirable results beyond those conventionally provided by a simulator.

It is important to note that other expressions may be defined by the user, and inputted, via user-operable expression input and event defining means, or I/O device 26, to copies of template descriptions 16, thereby to control the simulation process itself. For example, the user may define an expression such as:

IF $P_R > 1$ THEN HALT ELSE CONTINUE (2).

Such an expression would tell co-processor 34, which in this example executes concurrently with, and has means 34a for interrupting data base production by, simulator 28, to halt the simulation run, in the event that the power dissipated in resistor R exceeds 1 W. Obviously, if the event does not occur, the simulation will run to completion, thereby producing data base results including $V_R$, $I_R$ and $P_R$. If, on the other hand, the instantaneous power dissipated in resistor R exceeds 1 W, i.e., if the expression (2) argument, $P_R > 1$, is true, the simulation will be halted, and will not run to completion.

The ability to define an 'event', e.g. the dissipation of more than 1 W in resistor R, thereby to control core simulator 28, e.g. by halting it, has been found to have great utility Clearly, if R were a ¼ watt resistor, then even the instantaneous 1 W dissipation event would indicate that something is wrong with the model defined by the user or with the stimulus supplied by system topology and values 18. In real life, of course, the resistor would have been damaged, or at least thereafter would not perform predictably and reliably. Thus, by the simulation enhancement apparatus of the present invention, costly errors may be avoided without incurring costly simulation runs.

Although the example illustrated herein is trivial, nonetheless it may be seen that if the system being simulated were to comprise several hundred or thousand individual devices, including both active and passive devices, the CPU intensive and thus costly execution of core simulator 28 might take several seconds, minutes or hours. Typically, the results of such a run would prove useless, and would have to be repeated, were it discovered that a component were severely underrated in its voltage, current, or power capacity.

The preferred method of the present invention now may be understood, in light of the description of the preferred embodiment of the apparatus. By developing elemental models representing a complete elemental characterization, e.g. by augmenting template description 16 with expressions describing the relationship between voltage, current and power; by simulating a system defined by these models, e.g. system 20 in FIG. 2, to produce a partial results data base including voltage as a function of time; and by processing this partial results data base, using the complete elemental characterization now included in the elemental models, to produce simulation completion results, a partial results data base may be enhanced to yield further, desirable results.

Importantly, the developing of elemental models that represent a complete characterization is user-specific, or application-specific, and thus is highly adaptable to a particular user's needs. Equally importantly, the library of elemental models, which includes those elemental characteristics, or equations, that are essential to the simulator's solution of the system of equations is not modified by the user-inputted expressions, and thus may be maintained in a central data base management functional area.

The advantages offered by the invention should be apparent to those skilled in the art. By the use of a co-processor capable of evaluating a user defined expressions and either 1) enhancing a partial results data base that is produced by a simulator to provide more complete circuit characterization, or 2) processing, concurrent with the simulation, the interim results data base outputted thereby and the user-inputted expressions contained in the user-specific copy of the template descriptions, to control, e.g. halt, the simulation upon the occurrence of a user-defined event. Advantageously, the method and apparatus of the invention provides greatly enhanced simulation results and provides for the avoidance of otherwise costly and time consuming simulation runs. Finally, the central library of elemental models is unmodified by the user-specific expressions inputted, so that they may be maintained, and updated with models of new devices as required, in a central data base, for the general use of all users.

Accordingly, while a preferred embodiment of the invention and a preferred method of the invention have been described herein, it is appreciated that further modifications are possible that come within the scope of the invention.

It is claimed and desired to secure by Letters Patent:

1. A stimulation system comprising:
   an elemental modeling subsystem;
   a simulation-generated partial simulation results data base structure; and
   data base enhancement software operatively associated with said subsystem and said structure, said software including means for deriving simulation completion results from said subsystem and from said structure.

2. The system of claim 1, wherein said partial simulation results and said simulation completion results represent waveforms.

3. In a simulation system having an elemental modeling subsystem and providing a results data base which represents fewer than all of the system stimulus-response attributes within the purview of the modeling subsystem, the improvement comprising:
   means for enhancing such results data base, said enhancing means including a processor in operative association with such data base and with said modeling subsystem, said processor producing additional system stimulus-response attributes not represented in such data base.

4. A method of producing a simulation completion results data base representing elemental responses to predefined stimuli comprising:
   developing elemental models representing a complete elemental characterization;
   simulating a system defined by such models to produce a partial results data base; and
   processing such partial results data base, said processing being based upon said elemental models, to produce simulation completion results.

5. In a simulation system having an elemental modeling subsystem and providing interim results data base production, simulation enhancement software comprising:
   means operatively associated with such modeling subsystem for defining an event;
   a co-processor executing concurrently with such simulation system; and
   means operatively associated with said event defining means and with said co-processor for interrupting such data base production upon the occurrence of such event.

6. The enhancement software of claim 5, wherein said event defining means is user-operable.

7. The enhancement software of claim 6, wherein said event defining means includes expression input means for defining such event in terms of a logical expression and wherein said co-processor evaluates said logical expression to determine the occurrence of such event and activates said interrupting means upon such occurrence.

* * * * *